United States Patent [19]

Curtis

[11] Patent Number: 4,839,538
[45] Date of Patent: Jun. 13, 1989

[54] IMPACT BIPOLAR INTEGRATED CIRCUIT DESIGNED TO ELIMINATE OUTPUT GLITCHES CAUSED BY NEGATIVE CHIP GROUND SPIKES

[75] Inventor: Susan A. Curtis, Howe, Tex.

[73] Assignee: Texas Instruments Incorporated, Dallas, Tex.

[21] Appl. No.: 942,554

[22] Filed: Dec. 16, 1986

[51] Int. Cl.⁴ ................. H03K 19/003; H03K 19/088; H03K 19/084; H03K 17/06

[52] U.S. Cl. .................... 307/456; 307/443; 307/473; 307/458; 307/547; 307/549

[58] Field of Search ............... 307/440, 443, 456, 457, 307/458, 254, 255, 542, 547, 549, 546, 473

[56] References Cited

U.S. PATENT DOCUMENTS

| | | | |
|---|---|---|---|
| 4,330,723 | 5/1982 | Griffith | 307/456 |
| 4,339,675 | 7/1982 | Ramsey | 307/456 X |
| 4,481,430 | 11/1984 | Houk et al. | 307/456 X |
| 4,584,490 | 4/1986 | West | 307/458 X |
| 4,593,210 | 6/1986 | Boyer | 307/456 X |

Primary Examiner—Stanley D. Miller
Assistant Examiner—David R. Bertelson
Attorney, Agent, or Firm—Thomas R. FitzGerald; Leo N. Heiting; Melvin Sharp

[57] ABSTRACT

The disclosure relates to a circuit for compensation for ground glitches in an integrated circuit wherein there is provided a glitch fix circuit wherein a node is responsive to a negative shift in the level of ground relative to Vcc to turn on a transistor and drain current to ground from the input circuits to transistors in the circuit under control. A feedback circuit is provided which is out of phase with the circuit input of the circuit being controlled and which is one Von above ground. This feedback circuit inhibits the glitch fix circuit in the event that the increase in voltage difference between the input to the circuit being protected and ground is a result of a high input signal rather than noise which lowers the ground level.

6 Claims, 4 Drawing Sheets

IMPACT BIPOLAR INTEGRATED CIRCUIT DESIGNED TO ELIMINATE OUTPUT GLITCHES CAUSED BY NEGATIVE CHIP GROUND SPIKES

BACKGROUND OF THE INVENTION

1. Field of the Invention

This invention relates to electronic circuits and, more specifically, to methods and circuitry for preventing undesirable output voltage fluctuations in integrated circuitry.

2. Brief Description of the Prior Art

Integrated circuits associated with multiple output devices often have undesirable output signal fluctuations which are caused by negative ground voltage variations, commonly termed glitches. The simultaneous switching of many multiple output devices causes excess current to be dumped into the internal ground of the circuitry. When an output of an integrated circuit is switched high to low, the charge on a capacitive load will be discharged into the chip ground according to the capacitor-current formula $i = C(dv/dt)$. The internal ground nodes of such circuits are connected to an external ground node through a package pin which includes an inherent inductance. The external ground is fixed to zero volts. The excess current dumped into the internal ground and the external ground causes both positive and negative internal ground voltage fluctuations as described by the inductor-voltage equation $V = 1\, di/dt$. If only one output is switched, the current discharged from the load will cause only small fluctuations in chip ground. However, as the number of outputs switched increases, the chip ground movement increases significantly. This creates a problem because the input pin is tied to an external reference and does not vary with chip ground. Therefore, a large voltage as seen by the chip circuitry develops across the input circuitry as chip ground goes negative. If the input is in the low state $Vi1 = 0.5$ volts) the voltage across the input circuit ($Vi1 - Vgnd$) may be greater than the device threshold ($Vth = 2\,Vbe$), causing the input voltage to look high momentarily and the output to glitch.

In particular, the negative ground voltage fluctuations or glitches cause transistors in the integrated circuitry to prematurely turn on when the transistor emitters are referenced to internal ground and their bases are referenced to the external voltage supply. When such transistors prematurely turn on, the output of the circuitry often begins to oscillate and creates undesirable output signal fluctuations. Such internal ground voltage fluctuations will become increasingly worse as circuit designers strive to obtain faster switching of multiple output devices.

A need has thus arisen for compensation circuitry which can prevent or eliminate undesirable output signal fluctuations caused by internal ground voltage glitches. In particular, a need has arisen for controlling the effects caused by severe negative internal ground voltage fluctuations created by rapid switching of multiple output devices. Such compensation circuitry should be useful with both transistor and diode input devices, and should be controllable as to the level of compensation control.

The prior art has attempted to remedy this problem. In one such unpublished prior art attempt, a transistor is driven by the collector of the input PNP transistor. Experimental data has shown that this type of approach causes propogation delays to increase significantly if the input has a negative undershoot just prior to switching. In a second prior art solution, as set forth in the application of Janet L. Wise, Ser. No. 881,146, filed July 2, 1986, a circuit referenced through a capacitor to Vcc is used. This circuit is very sensitive to chip Vcc and ground movement and therefore requires careful adjustment of the component values. The circuitry which limits the current through transistor 42 in said application via the collector thereof is critical because, if not controlled, it can turn on and pull base drive away from transistor 30 when the input is high and transistor 30 should be on.

SUMMARY OF THE INVENTION

In accordance with the present invention, there is provided a negative glitch fix circuit which provides the desired result of compensating for negative glitches while, at the same time, minimizing the detrimental effects of the prior art circuits as noted hereinabove.

Briefly, in accordance with the present invention, there is provided a glitch fix circuit wherein a node is responsive to a negative shift in the level of ground relative to Vcc to turn on a transistor and drain current to ground from the input circuits to transistors in the circuit under control. A feedback circuit is provided which is out of phase with the circuit input of the circuit being controlled and which is one Von above ground. This feedback circuit inhibits the glitch fix circuit in the event that the increase in voltage difference between the input to the circuit being protected and ground is a result of a high input signal rather than noise which lowers the ground level.

The above is accomplished by providing a Schottky clamped transistor coupled between ground and the node of a circuit being protected. The clamp transistor is turned on to drain current from the node by the injection of current to the base thereof from a capacitor coupled to a second node to which the base of the clamp transistor is also coupled. The feedback transistor is also a Schottky clamped transistor which controls operation of the first transistor.

DESCRIPTION OF THE PREFERRED EMBODIMENT

Figure 1:
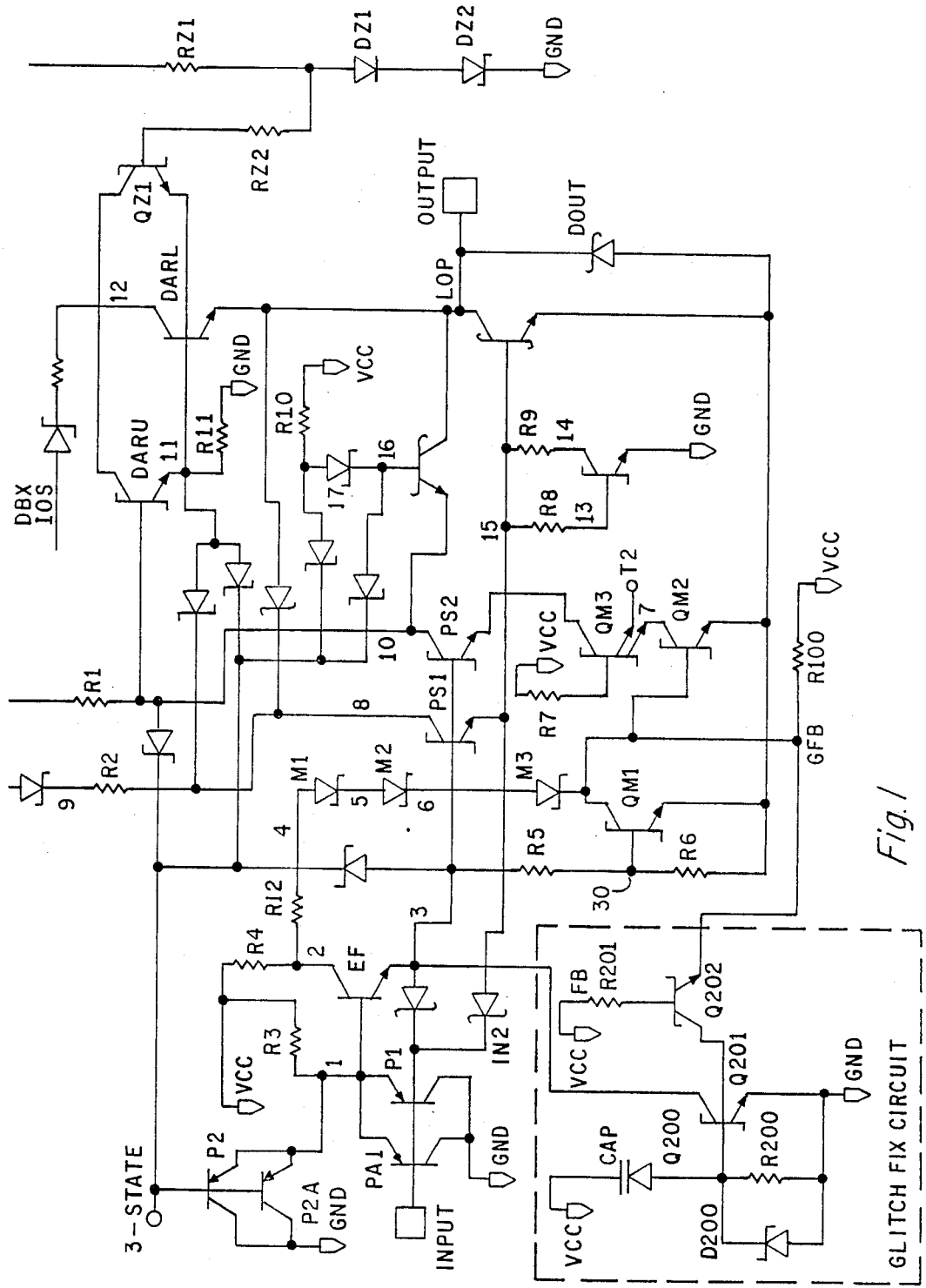
FIG. 1 is a circuit diagram of a prior art 3-state circuit with the glitch fix circuit of the present invention coupled thereto.

Referring first to FIG. 1, there is shown a standard prior art tri-state inverter circuit with the glitch fix circuit of the present invention, shown in the dotted square area, coupled thereto. Since the inverter circuit per se as well as the circuits of the succeeding FIGURES herein are in the prior art except for the glitch fix circuit shown therein, which is identical for each FIGURE except for the location of its attachment to the prior art circuit, they will not be discussed herein except to the extent necessary to indicate the transistors which set the reference input threshold and the location from which the feedback voltage is taken.

Without the glitch fix circuit present in FIG. 1, and with the input in the low state (vi1=0.5 volts), a negative ground spike of about −1.4 volts would result in a potential from input to ground of about 1.9 volts (vi1−Vgnd). The threshold is controlled by the Vbe of the input PNP transistors P1A and P1 (which can be a single dual emitter transistor), the emitter follower EF, the phase splitters PS1 and PS2 and the LOP, this being about 1.5 to 1.6 volts. Ground moves because of noise caused by the inductance in the packaging, this causing positive and negative noise on ground. The input is held at a fixed reference voltage by a separate circuit and is not affected by the same noise. Therefore, the ground voltage level is going negative while the input remains constant at 0.5 volts. Accordingly, when ground goes negative by about 1 volt there is a 1.5 voltage difference from input to ground. Since the circuit is unable to differentiate between this voltage as an input high rather than a ground glitch negative voltage, and because this voltage is greater than the input threshold of 2Vbe, approximately 1.5 volts at 25 degrees C. the output will respond as if a high level voltage was applied at the input and the emitter follower EF, phase splitters PS1 and PS2 and the lower output transistor LOP turn on, causing the output to glitch low momentarily. The output will then recover to its original state as soon as the chip ground has recovered so that Vi1−Vgnd >or=Vth.

The glitch fix circuit in accordance with the present invention is connected to a circuit under protection utilizing the requirements set forth hereinbelow. The circuit includes, as is evident from any of the FIGS. 1 to 4, a Schottky clamped transistor Q201 having its collector connected to a point in the circuit whereat charge buildup will cause the problems enumerated hereinabove. The emitter thereof is connected to ground and the base thereof is connected to the collector of Schottky clamped transistor Q202 and node X. Node X is the junction of the base of transistor Q201, a capacitor Q200 which is also coupled to Vcc, a resistor R200 which is also coupled to ground and a schottky diode D200 which is also coupled to ground. Transistor Q202 is the feedback transistor and has its base coupled to Vcc through resistor R201 and its emitter coupled to a point in the circuit which is 1 Von above ground and out of phase with the circuit input. Resistor R201 provides biasing so current through transistors Q201 and Q202 maintains node X biased at about 0.4 volts, thereby turning on the circuit in response to a smaller amount of noise. Diode D200 helps to maintain a positive bias on node X during positive ground movement for more rapid reaction when ground does go negative.

With the glitch fix circuit included, the circuit of FIG. 1 also responds to a negative going ground movement in that node X attempts to remain constant relative to Vcc through capacitor Q200 (CAP). With the glitch fix circuit attached as shown in FIG. 1, negative ground spikes cause the ground connected emitter of transistor Q201 to go negative. This causes node X to be pulled negative somewhat, but at a lower rate than ground because node X is referenced through transistor (capacitor) Q200 to Vcc. Transistor Q200 is used as a collector-base junction capacitor in this circuit. Base drive to transistor Q201 is provided by the capacitance of capacitor Q200 (CAP) according to i =C(dv/dt). When ground has fallen sufficiently such that there is one Vbe between node X and ground, transistor Q201 turns on and pulls charge from node 3, which is the emitter of the emitter follower, to the point where node 3 is pulled below 2Vbe so that the phase splitters PS1 and PS2 and the lower output LOP are held off, preventing the output from glitching low. The emitter follower EF can be turned on without affecting circuit operation. This is a point where the glitch voltage at node 3 would be sufficient to otherwise turn on the circuitry following the emitter follower EF but for the drain off of charge by the glitch fix circuit.

A major advantage of this circuit over the circuit shown in the above identified application is the feedback transistor Q202. Without the feedback transistor and with the input in a high state (Vih =2.5 volts), negative ground or positive Vcc spikes can still turn on transistor Q201. This is undesirable since, with the input high, node 3 should be at 2Vbe and the phase splitters PS1 and PS2 and the lower output LOP should both be on. If transistor Q201 is allowed to turn on with the input high, node 3 will be pulled below 2 Vbe, causing the phase splitters and the lower output to turn off and the output to glitch high. This is the reason for adding a resistor in the collector circuit of transistor Q11 of the above noted application to limit current to the glitch fix circuit, resulting in a compromise between the glitch fix circuit beneficial performance and undesirable side effects. With the feedback patch through transistor Q202, the need for a limiting resistor is eliminated. When the input is high, node 30 will be high, transistor QM1 will be on causing node 40 to be low at one Von (about 0.2 volts). This means that the feedback transistor Q202 will be on, which will hold node x low at 2Von (about 0.4 volts) and will prevent transistor Q201 from turning on. Vcc and Vgnd movement will still cause current to discharge from the capacitor Q200, however this current will have a path to ground through the feedback and transistor QM1. Therefore, with the input in the high state, transistor Q201 will be held off and node 3 will be undisturbed by the glitch fix circuit. This makes the fix easy to implement on a wide variety of circuits since there are few critical adjustment required.

With reference to the feedback circuit through transistor Q202, it is merely necessary that the emitter of transistor Q202 be referenced to a point in the circuit under protection which is out of phase with the input to the circuit and be one Von above ground so that, when the input goes positive, in the case of FIG. 1, the voltage across voltage divider resistors R5 and R6 increases to turn on transistor QM1 and thereby causing transistor Q201 to be held off to prevent drain of charge from node 3. As will be seen in subsequent FIGURES, the glitch fix circuit will continue to be identical, but the feedback transistor Q201 will be connected to different points in the circuit with the above noted requirements being satisfied.

In operation, assuming the voltage at the input is 0.5 volts above ground initially, the circuit is turned off. If the ground voltage now travels in a negative direction to 1 volt below the prior ground level, there is an attempt to turn on the phase splitter PS1 and PS2 and LOP. During this period transistor Q 201 is also turning on due to base drive from capacitor Q200. This pulls current from node 3, preventing the phase splitter and LOP from turning on. This maintains the output quiescent but does permit the emitter follower EF to turn on. If node 3 is low, then the voltage at node 30 between resistors R5 and R6 will be low and transistor QM1 will be off. Therefore the feedback transistor Q202 will not be operating and transistor Q201 can turn on to operate the glitch fix. If the input is high, node 30 will be high and turn on transistor QM1 and bring its collector low and turn on feedback transistor Q202. This will inhibit operation of transistor Q201 and thereby maintain the glitch fix circuit off. It can be seen the the glitch fix circuit will turn on prior to the circuitry following node 3 because the threshold of the glitch fix circuit is lower.

Figure 2:
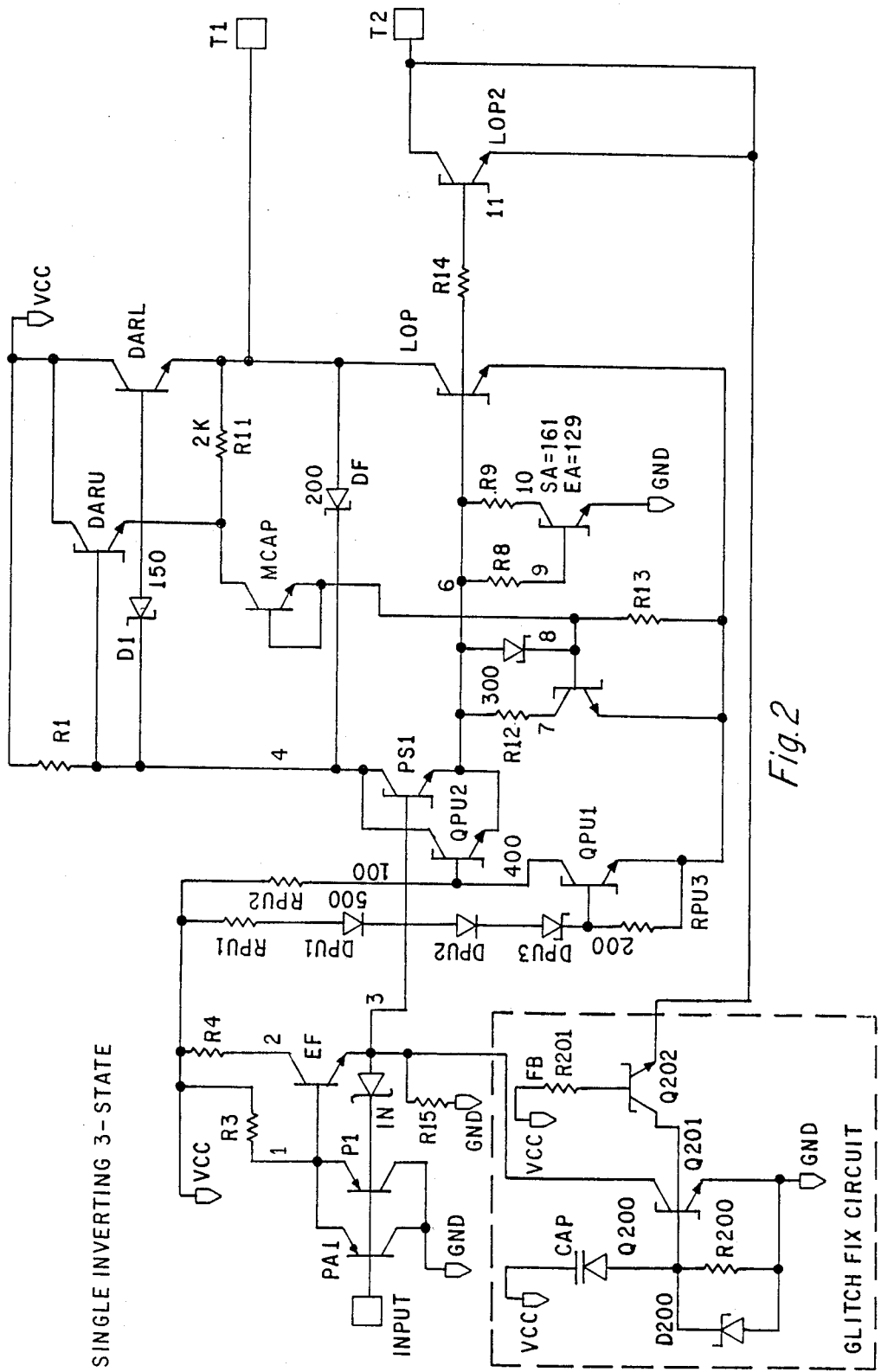
FIG. 2 is a circuit diagram of a prior art single inverting 3-state control circuit with the glitch fix circuit of the present invention.
Figure 3:
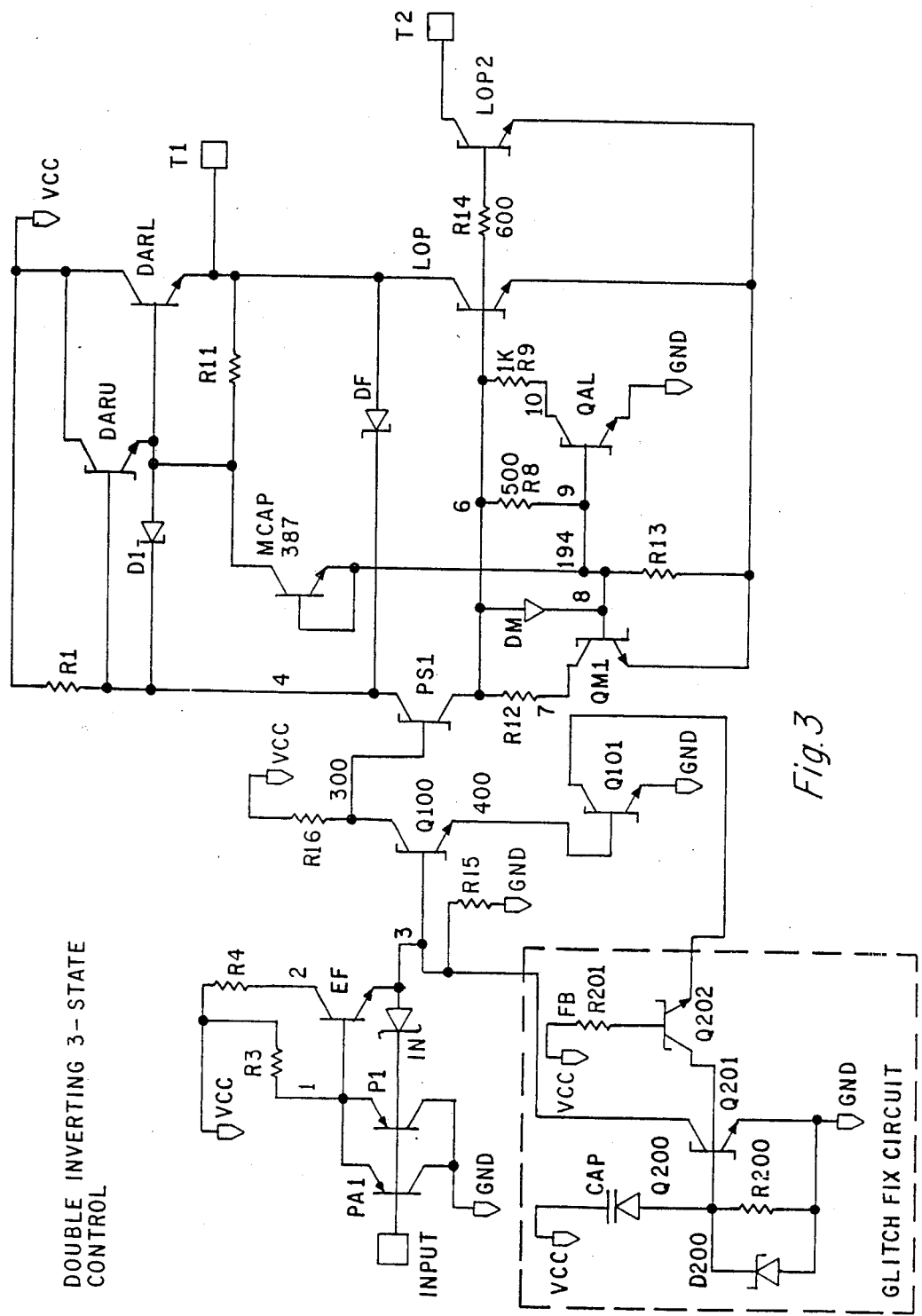
FIG. 3 is a circuit diagram of a prior art double inverting 3-state control circuit with the glitch fix circuit of the present invention.
Figure 4:
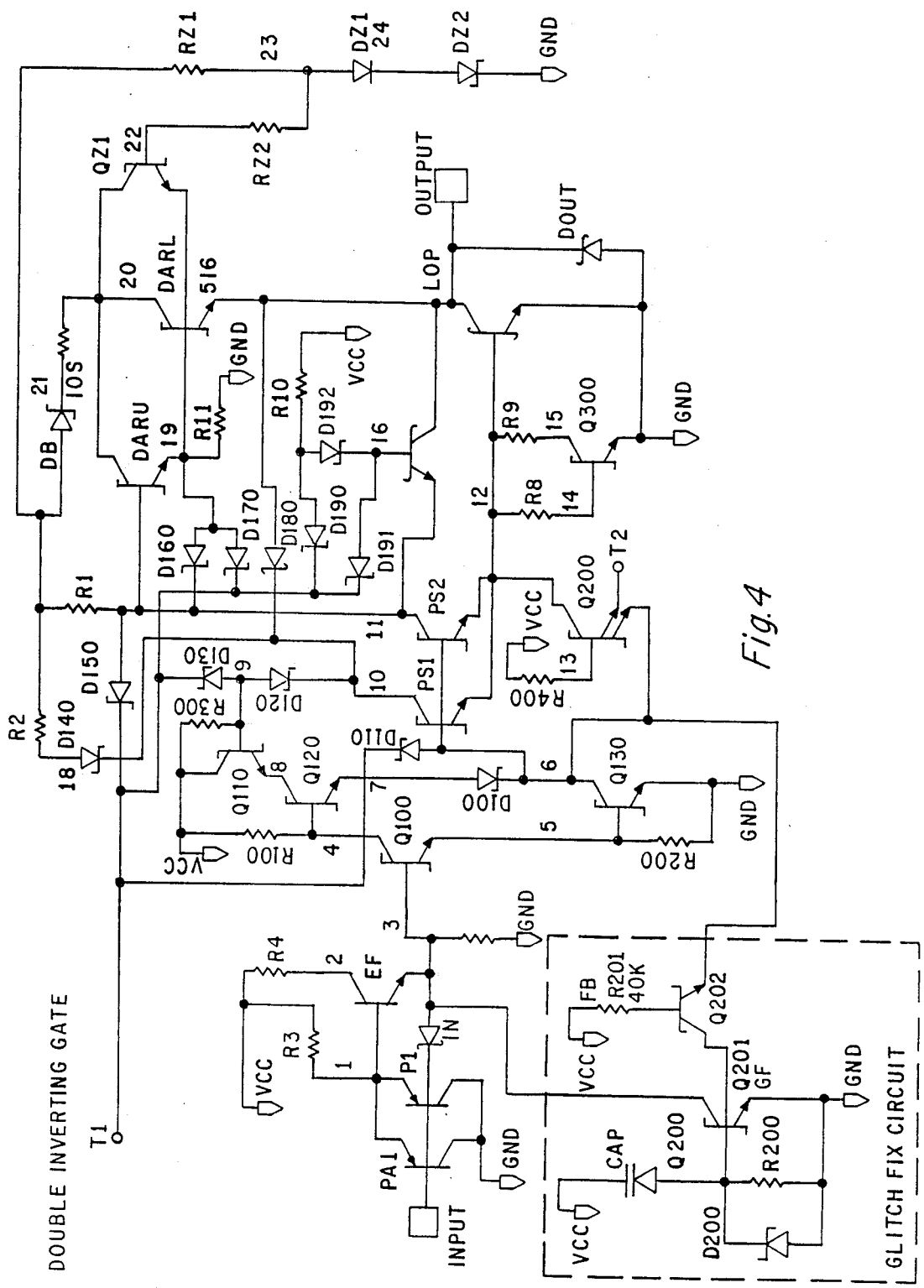
FIG. 4 is a circuit diagram of a double inverting gate circuit with the glitch fix circuit of the present invention.

FIGS. 2 to 4 disclose the use of the same glitch fix circuit as in FIG. 1 used in conjunction with different circuits, FIG. 2 being a single inverting 3-state circuit, FIG. 3 being a double inverting 3-state control circuit and FIG. 4 being a double inverting gate circuit. In each of these circuits, the feed back path is attached to a different point in the circuit. The only requirements are that the feedback be attached to a node that is low at one Von, is out of phase with the input and does not rise high enough to reverse bias the base-emitter junction of transistor Q202 more than 3 volts.

Referring now to FIG. 2, while the prior art circuit is different from that of FIG. 1, the glitch fix circuit is identical except for the points of coupling therebetween. In this circuit the feedback transistor Q202 is connected to the circuit output T2 which is low when the circuit input is high, and will turn on transistor Q202 to thereby keep transistor Q201 and the glitch fix circuit off. When the circuit input is low, T2 will be floating, thereby not having control over the glitch fix circuit.

It should be understood that the problem noted hereinabove is not limited to IM parts, but rather is seen on a wide range of integrated circuit families, including AS, F, HC, PAL, PROM and AC part types. This glitch fix circuit can also be used on any bipolar technology and are applicable to CMOS technologies as well.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:
1. A circuit for compensating for ground glitches in integrated circuits comprising:
    (a) an integrated circuit having an input node and a variable internal ground having a predetermined desired reference voltage level, and
    (b) compensating means coupled between said input node and said internal ground, said compensating means including:
    (c) normally non-conducting switch means coupled between said input node and said internal ground,
    (d) control means responsive to a negative voltage level of predetermined minimum magnitude from said predetermined desired reference voltage level at said internal ground for causing said switch means to become conducting to lower the voltage level of said input node in the direction of said predetermined desired reference voltage level, and
    (e) feedback means responsive to a predetermined condition in said integrated circuit to inhibit operation of said control means, wherein said feed back means comprises a transistor having first and second main electrodes and a control electrode, said first electrode being coupled to a node in said integrated circuit which is out of phase with said input and about one $V_{on}$ above said internal ground.

2. A circuit as set forth in claim 1 wherein said compensating means includes a transistor having first and second main electrodes and a control electrode, said control means being coupled to said control electrode.

3. A circuit as set forth in claim 2 wherein said transistor is a Schottky clamped transistor.

4. A circuit as set forth in claim 1 wherein said control means comprises a node capacitively coupled to a fixed voltage source and resistively coupled to said internal ground.

5. A circuit as set forth in claim 2 wherein said control means comprises a node capacitively coupled to a fixed voltage source and resistively coupled to said internal ground.

6. A circuit as set forth in claim 3 wherein said control means comprises a node capacitively coupled to a fixed voltage source and resistively coupled to said internal ground.

* * * * *